United States Patent
Chia et al.

(10) Patent No.: US 7,288,836 B2
(45) Date of Patent: Oct. 30, 2007

(54) STACKED ALIGNMENT MARK AND METHOD FOR MANUFACTURING THEREOF

(75) Inventors: Wei-Sheng Chia, Hsinchu (TW); Chih-Jung Chen, Taipei (TW); Chung-An Chen, Taichung (TW); Chih-Chung Huang, Hsinchu County (TW)

(73) Assignee: United Microelectronics Corp., Hsinchu (TW)

( * ) Notice: Subject to any disclaimer, the term of this patent is extended or adjusted under 35 U.S.C. 154(b) by 18 days.

(21) Appl. No.: 11/162,117

(22) Filed: Aug. 29, 2005

(65) Prior Publication Data
US 2007/0090548 A1   Apr. 26, 2007

(51) Int. Cl.
*H01I 23/02* (2006.01)
(52) U.S. Cl. .................................. 257/686; 257/797
(58) Field of Classification Search ............... 257/797, 257/686
See application file for complete search history.

(56) References Cited

U.S. PATENT DOCUMENTS 6,420,791 B1* 7/2002 Huang et al. ............... 257/797

* cited by examiner

*Primary Examiner*—Roy Potter
(74) *Attorney, Agent, or Firm*—Jianq Chyun IP Office

(57) ABSTRACT

A stacked alignment mark. The stacked alignment mark comprises a first alignment mark and a second alignment mark. The first alignment mark is located in a first film layer, wherein the first alignment mark is composed of a plurality of conductive wires. The second alignment mark is located in a second film layer under the first film layer. The first alignment mark is located in a first region corresponding to a second region in which the second alignment mark is located. Moreover, the second alignment mark at least contains a third region directly under a space between each two adjacent first conductive wires.

8 Claims, 4 Drawing Sheets

STACKED ALIGNMENT MARK AND METHOD FOR MANUFACTURING THEREOF

BACKGROUND OF THE INVENTION

1. Field of Invention

The present invention relates to a semiconductor device and a method for manufacturing thereof. More particularly, the present invention relates to a stacked alignment mark and the method for forming thereof.

2. Description of Related Art

Photolithography is a crucial process for the process for manufacturing the semiconductor device. In the conventional process for manufacturing a device, depending on the manufacturing complexity of a device, it is necessary to perform the photolithography for about 10 to 18 times. In order to correctly transfer the patterns on the photo mask onto the wafer, before the exposure process of each photolithography process is performed, it is necessary to perform an alignment process for aligning the film layer to each other so that the improper pattern transfer will not happen.

Typically, the alignment mark is formed on the wafer for forming scattering site or diffraction edge during the alignment process. Hence, while a light source is provided to illuminate the wafer, the diffraction patterns caused by the light beam passing by the alignment mark are reflectively projected onto the alignment sensor or onto the first-order diffraction interferometer alignment system.

However, in the semiconductor process, there exist some problems in aligning the film layers to each other. For example, while aligning an alignment mark of a dielectric film layer over a substrate, since there is another dielectric film layer located under the alignment mark, a portion of the light passing through the alignment mark also pass through the lower dielectric film layer. Therefore, the reflect beam doest not reflect to the alignment sensor. Hence, the alignment result is poor. That is, the misalignment happens so that the alignment accuracy between the film layers is affected.

SUMMARY OF THE INVENTION

Accordingly, at least one objective of the present invention is to provide a stacked alignment mark capable of increasing the constructive interference for providing an intensive light signal. Hence, the alignment accuracy is increased.

At least another objective of the present invention is to provide a alignment method capable of providing an intensive light signal to increase the alignment accuracy.

To achieve these and other advantages and in accordance with the purpose of the invention, as embodied and broadly described herein, the invention provides a stacked alignment mark. The stacked alignment mark comprises a first alignment mark and a second alignment mark. The first alignment mark is located in a first film layer, wherein the first alignment mark is composed of a plurality of conductive wires. The second alignment mark is located in a second film layer under the first film layer. The first alignment mark is located in a first region corresponding to a second region in which the second alignment mark is located. Moreover, the second alignment mark at least contains a third region directly under a space between each two adjacent first conductive wires.

In the present invention, the second alignment mark can be composed of a plurality of second conductive wires. Moreover, the second alignment mark can be in a form of window lattice structure or rectangle structure. In addition, the first alignment mark can be formed of aluminum, tungsten, copper or alloy thereof and the second alignment mark can be formed of aluminum, tungsten, copper or alloy thereof. Furthermore, the first film layer can be formed of silicon oxide, silicon nitride, silicon oxy-nitride or other dielectric material and the second film layer can be formed of silicon oxide, silicon nitride, silicon oxy-nitride or other dielectric material.

The present invention also provides a method for forming an interconnect. The method comprises steps of providing a substrate having a device region and an alignment region and then forming a first film layer over the substrate. Thereafter, a portion of the first film layer is removed to form a first alignment mark pattern in the alignment region and a first conductive layer is formed to fill the first alignment mark pattern to form a first alignment mark. Further, a second film layer is formed over the first film layer and then a portion of the second film layer is removed to form a plurality of openings in the device region and to form a second alignment mark pattern in the alignment region. Further, a second conductive layer is formed to fill the openings to form a plurality of first conductive wires and to fill the second alignment mark pattern to form a second alignment mark. The second alignment mark is composed of a plurality of second conductive wires and the first alignment mark is located in a first region corresponding to a second region in which the second alignment mark is located. Also, the first alignment mark at least contain a third region directly under a space between each two adjacent second conductive wires. Thereafter, a third film layer and a hard mask layer are formed over the second film layer sequentially and then a portion of the hard mask layer and the third film layer is removed to form a plurality of via openings in the hard mask layer and the third film layer in the device region. Further, a third conductive layer is formed in the via openings.

In the present invention, the first alignment mark can be composed of a plurality of second conductive wires. Furthermore, the first alignment mark can be in a form of window lattice structure or rectangle structure. Moreover, the hard mask layer can be formed of a refractory metal nitride such as titanium nitride, tantalum nitride or tungsten nitride. In addition, the first alignment mark can be formed of aluminum, tungsten, copper or alloy thereof and the second alignment mark can be formed of aluminum, tungsten, copper or alloy thereof. Furthermore, the first film layer can be formed of silicon oxide, silicon nitride, silicon oxy-nitride or other dielectric material and the second film layer can be formed of silicon oxide, silicon nitride, silicon oxy-nitride or other dielectric material.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1A:
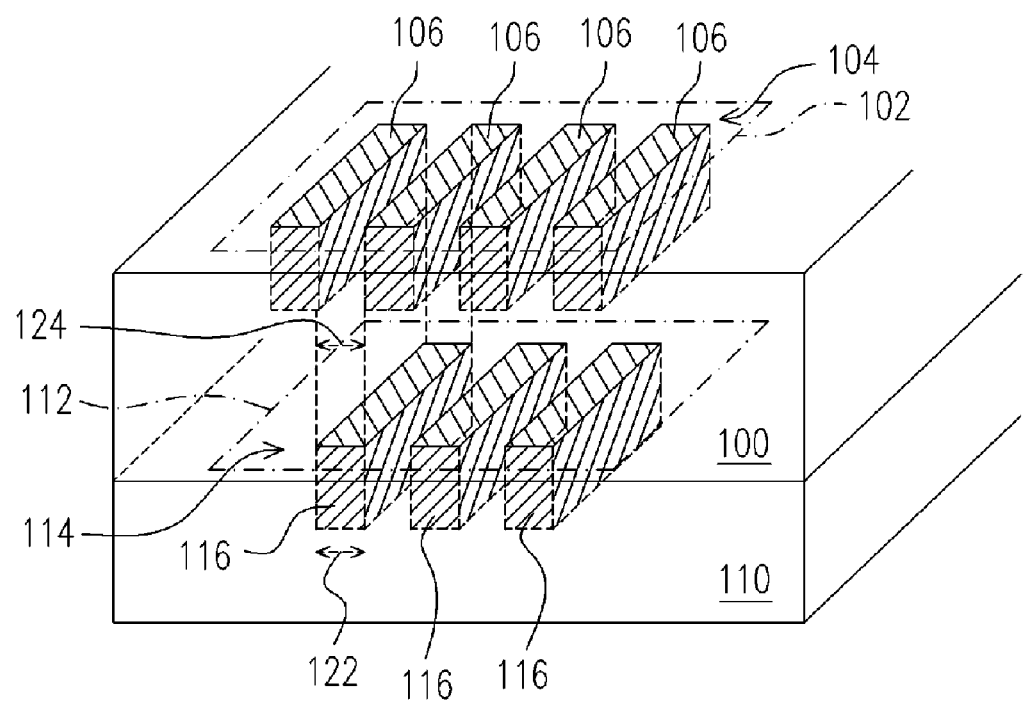
FIG. 1A through FIG. 1C are schematic views of a stacked alignment mark according to a preferred embodiment of the invention.
Figure 1B:
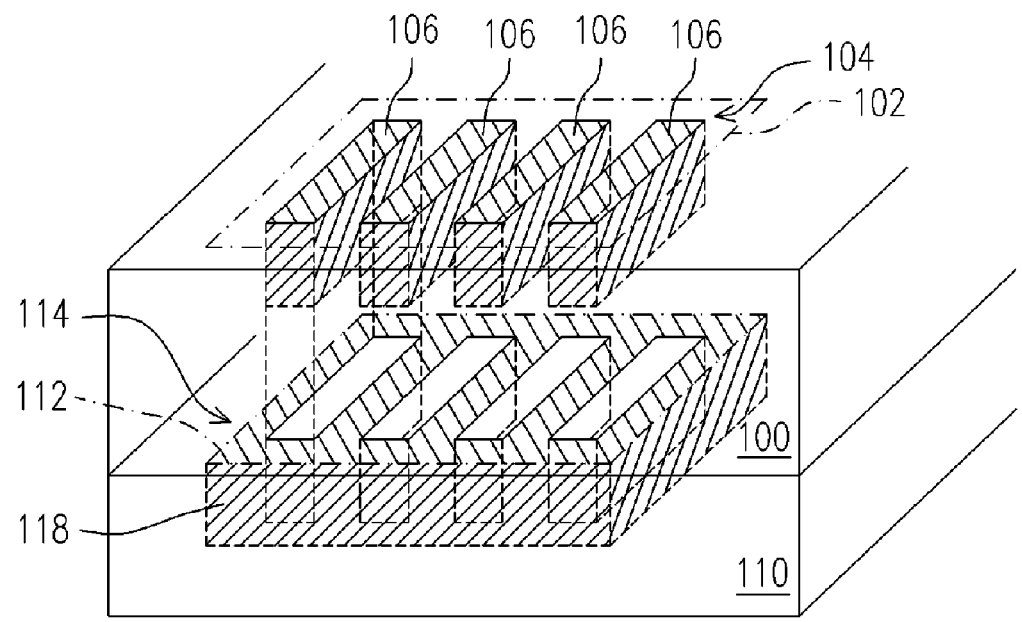
Figure 1C:
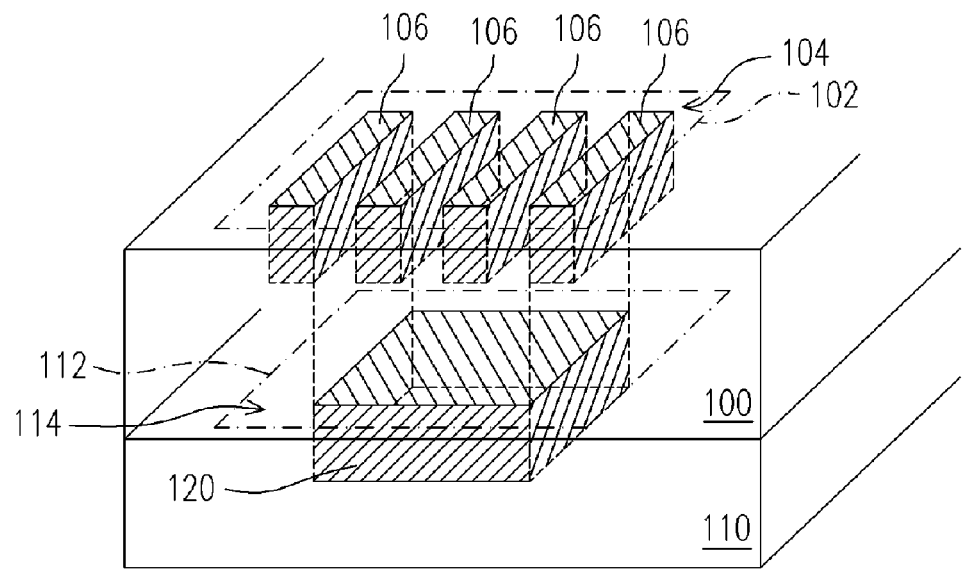

FIG. 1A through FIG. 1C are schematic views of a stacked alignment mark according to a preferred embodiment of the invention.

The stacked alignment mark of the present invention is formed in two consecutive film layers formed over the substrate. The alignment mark patterns are formed in the alignment regions in the consecutive film layers respectively and the alignment region in the consecutive film layers are corresponding with each other. Then, a conductive material is filled into the alignment mark patterns to form the alignment marks. The alignment mark located in the upper film layer is composed of several conductive wires and the alignment mark located in the lower film layer comprises at least one conductive wire positioned in the lower film layer corresponding to a space between adjacent conductive wires.

FIGS. 1A through 1C only show the alignment marks in the consecutive film layers and do not illustrate the structures of the substrate.

As shown in FIG. 1A, the stacked alignment mark comprises an alignment mark 104 and an alignment mark 114. The alignment mark 104 is located in the film layer 100 and is composed of several conductive wires 106. The alignment mark 114 is located in the film layer 110 is composed of several conductive wires 116. The conductive wires 106 and the conductive wires 116 are alternatively arranged in the film layers 100 and 110. That is, the location of each conductive wire 116 is corresponding to the space between each two adjacent conductive wires 106. The film layer 100 can be, for example, formed from silicon oxide, silicon nitride, silicon oxy-nitride or other dielectric material. The alignment mark 104 can be made of aluminum, tungsten, copper, alloy thereof or other material possessing reflective characteristic. In addition, film layer 110 is located below the film layer 100. The film layer 110 can be, for example, formed from silicon oxide, silicon nitride, silicon oxy-nitride or other dielectric material. The alignment mark 114 can be made of aluminum, tungsten, copper, alloy thereof or other material possessing reflective characteristic. The alignment mark 104 is located in the region 102 corresponding to the region 112 in which the alignment mark 114 is positioned.

In the embodiment, the size of each conductive wire 116 is as same as the size of the conductive wire 106. The width 112 of each conductive wire 116 is equal to the space 124 between each two adjacent conductive wires 106. Although the size relationship and the width relationship between the conductive wires 106 and the conductive wires 116 are recited above, the size relationship and the width relationship between the conductive wires 106 and the conductive wires 116 are not limited to. If the size of each conductive wire 116 is equal to the size of each conductive wire 106, the width 122 of each conductive wire 116 can larger than the space 124 between each two adjacent conductive wires 106. Furthermore, the size of each conductive wire 106 can be different from the size of each conductive wire 116 as long as each conductive wire 116 at least contains the region directly under the space between each two adjacent conductive wires 106.

As shown in FIG. 1B, the stacked alignment mark comprises the alignment mark 104 and the alignment mark 114. The alignment mark 104 is composed of several conductive wires 106. The alignment mark 114 is made of conductive material in a form of window lattice structure 118. In this embodiment, the pattern of the alignment mark 104 and the pattern of the alignment mark 114 are complementary to each other. Although the arrangement relationship between the alignment mark 104 and the alignment mark 114 is recited above, the arrangement of the alignment mark 104 and the alignment mark 114 is not limited to as long as the pattern of the alignment mark 114 contains the region directly under the space between each two adjacent conductive wires 106.

As shown in FIG. 1C, the stacked alignment mark comprises the alignment mark 104 and the alignment mark 114. The alignment mark 104 is composed of several conductive wires 106. The alignment mark 114 is made of conductive material in a form of rectangle structure 120. In this embodiment, the size of the rectangle structure 120 is equal to the size of the region between the outmost conductive wires 106. Although the size relationship between the alignment mark 104 and the alignment mark 114 is recited above, the size of the alignment mark 104 and the alignment mark 114 is not limited to as long as the alignment mark 114 contains the region directly under the space between each two adjacent conductive wires 106.

Since the stacked alignment mark can block the incident light during beam the alignment process is performed, the light signal is enhanced and the alignment accuracy is increased. That is, while the alignment process is performed, the incident light beam passing through the alignment mark 104 in upper film layer is blocked by the alignment mark 114 in the lower film layer and reflected from the alignment 114. Therefore, the constructive interference is enhanced so as to provide more intensive light signal. Hence, the alignment accuracy is increased.

In addition, since the alignment marks 104 and 114 are located in the corresponding regions 102 and 112 in the film layers 100 and 110 respectively, the area occupied by the stacked alignment mark is relatively small.

FIG. 2A through FIG. 2E are schematic views of a method for forming an interconnect according to another preferred embodiment of the invention.

Figure 2A:
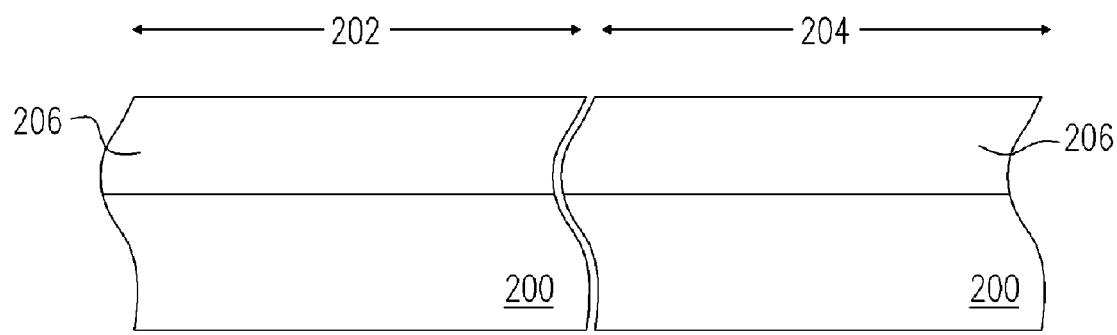
FIG. 2A through FIG. 2E are schematic views of a method for forming an interconnect according to another preferred embodiment of the invention.

As shown in FIG. 2A, a substrate 200 having a device region 202 and an alignment region 204 is provided. A film layer 206 is formed over the substrate 200. The film layer 206 can be, for example, formed from silicon oxide, silicon nitride, silicon oxy-nitride or other dielectric material by chemical vapor deposition.

Figure 2B:
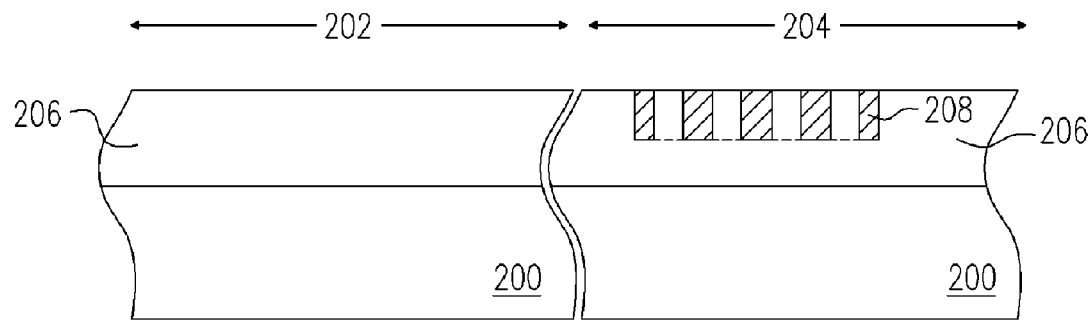

As shown in FIG. 2B, a portion of the film layer 206 is removed to form an alignment mark pattern in the alignment region 204 in the film layer 206. A conductive film layer is formed to fill the alignment mark pattern to form an alignment mark 208. The method for removing the portion of the film layer 206 can be, for example, an etching process. The alignment mark can be, for example, formed from aluminum, tungsten, copper, alloy thereof or other material possessing reflective characteristic.

The alignment mark 208 can be, for example, composed of several conductive wires 116 (as shown in FIG. 1A). In addition, the alignment mark 208 can be, for example, in a form of window lattice structure 118 (as shown in FIG. 1B) or rectangle structure 120 (as shown in FIG. 1C). In this embodiment, the present invention is described according to the alignment mark 208 in a form of window lattice structure 118.

Figure 2C:
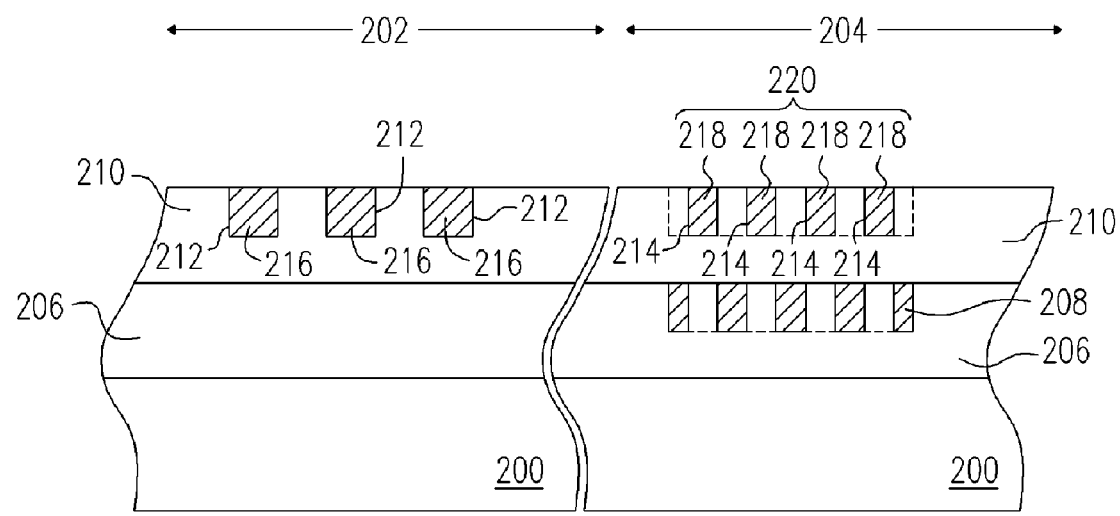

As shown in FIG. 2C, a film layer 210 is formed over the film layer 206. The film layer 210 can be, for example, formed from silicon oxide, silicon nitride, silicon oxy-nitride or other dielectric material by chemical vapor deposition. Then, a portion of the film layer 210 is removed to form several openings 212 in the device region 202 in the film layer 210 and an alignment mark pattern 214 in the alignment region 204 in the film layer 210. A conductive film layer is formed to fill the openings 212 to form several conductive wires 216 and to fill the alignment mark pattern to form an alignment mark 220. The method for removing the portion of the film layer 210 can be, for example, an etching process.

Notably, the alignment mark 208 is formed in the region corresponding to the region where the alignment mark 220 is formed so that the alignment mark 208 and the alignment mark 220 together form a stacked alignment mark. Hence, the area occupied by the stacked alignment mark is reduced. Furthermore, since the light beam can be blocked by the stacked alignment mark, the light signal is enhanced during the alignment process is performed. Therefore, the alignment accuracy is increased.

Figure 2D:
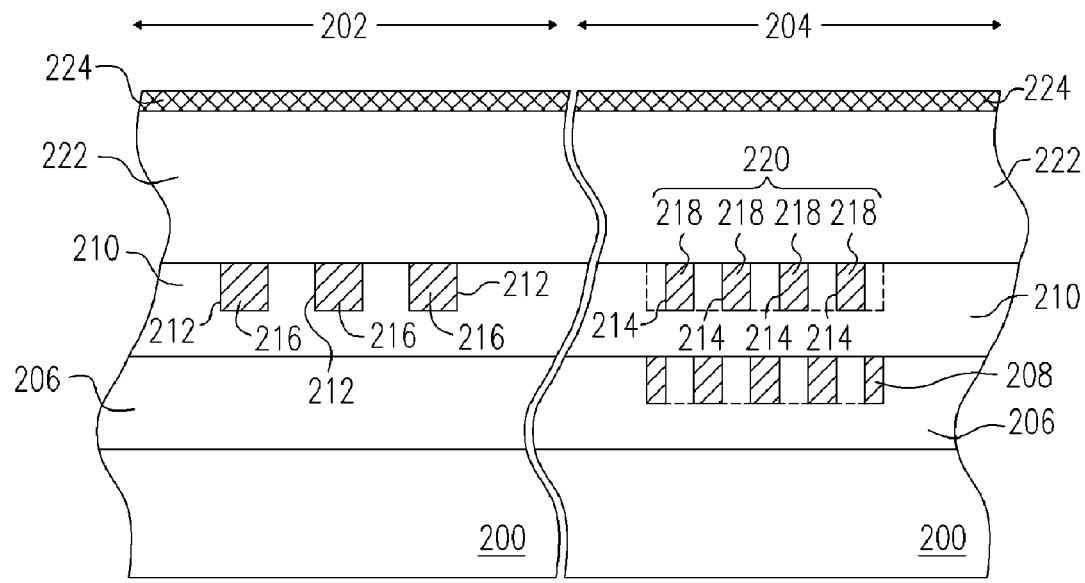

As shown in FIG. 2D, a film layer 222 and a hard mask layer 224 are formed over the film layer 210. The film layer 222 can be formed from silicon oxide, silicon nitride, silicon oxy-nitride or other dielectric material by chemical vapor deposition. The hard mask layer 224 can be, for example, formed from a refractory metal nitride such as titanium nitride, tantalum nitride or tungsten nitride. The method for forming the hard mask layer 224 can be, for example, chemical vapor deposition.

Figure 2E:
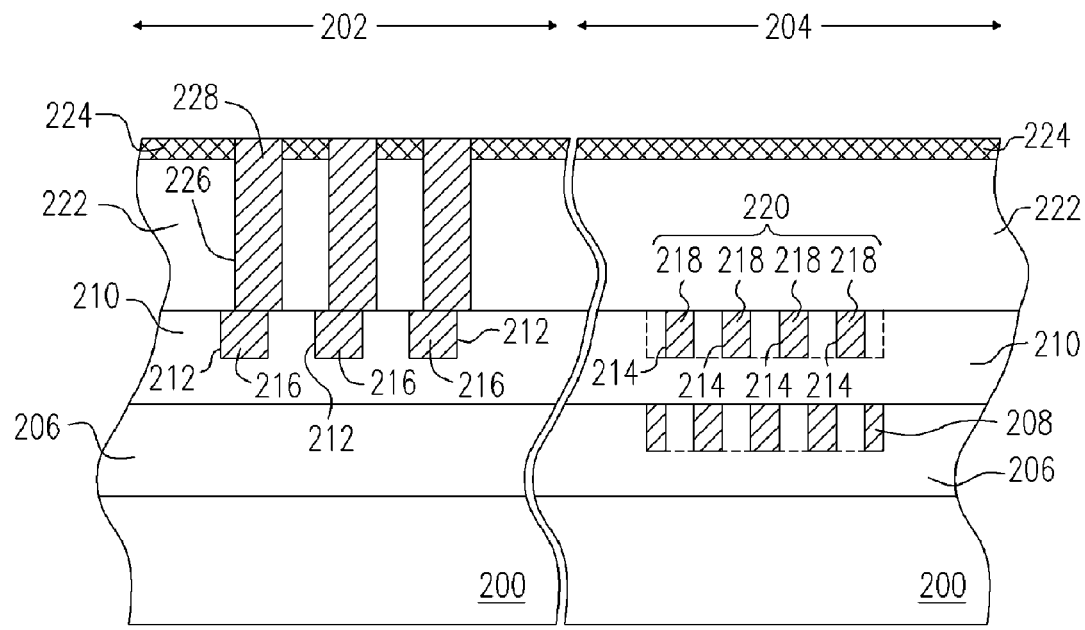

As shown in FIG. 2E, a portion of the hard mask layer 224 and the film layer 222 in the device region 202 is removed to form several via opening 226 in the hard mask layer 224 and the film layer 222 over the conductive wires 216 in the device region 202. The method for removing the portion of the hard mask layer 224 and the film layer 222 can be, for example, an etching process. A conductive layer is formed to fill the via openings 226 to form several via plugs 228.

Notably, since the hard mask layer 224 can absorb and block light beam, the light signal is reflected by the hard mask layer 224 during the alignment process is performed. Therefore, the alignment accuracy. However, because the stacked alignment mark composed of the alignment marks 208 and 220 is located in the lower film layers, the incident light beam can be blocked by the stacked alignment mark. Therefore, the light signal is enhanced and the alignment accuracy is increased.

In the present invention, the area occupied by the stacked alignment mark is relatively small. Further, the incident light beam is blocked by the stacked alignment mark so that the light signal is enhanced and the alignment accuracy is increased. Also, the problem due to hard mask layer absorbing and blocking light beam can be solved since the stacked alignment mark can efficiently enhance the light signal.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A stacked alignment mark, comprising:
a first alignment mark located in a first film layer, wherein the first alignment mark is composed of a plurality of conductive wires; and
a second alignment mark located in a second film layer under the first film layer, wherein the first alignment mark is located in a first region corresponding to a second region in which the second alignment mark is located and the second alignment mark at least contains a third region directly under a space between each two adjacent first conductive wires.

2. The stacked alignment mark of claim 1, wherein the second alignment mark is composed of a plurality of second conductive wires.

3. The stacked alignment mark of claim 1, wherein the second alignment mark is in a form of window lattice structure.

4. The stacked alignment mark of claim 1, wherein the second alignment mark is in a form of rectangle structure.

5. The stacked alignment mark of claim 1, wherein the first alignment mark is selectively made of aluminum, tungsten, copper or alloy thereof.

6. The stacked alignment mark of claim 1, wherein the second alignment mark is selectively made of aluminum, tungsten, copper or alloy thereof.

7. The stacked alignment mark of claim 1, wherein the first film layer is selectively made of silicon oxide, silicon nitride, silicon oxy-nitride or other dielectric material.

8. The stacked alignment mark of claim 1, wherein the second film layer is selectively made of silicon oxide, silicon nitride, silicon oxy-nitride or other dielectric material.

* * * * *